(12) United States Patent
Thomas et al.

(10) Patent No.: US 7,132,058 B2
(45) Date of Patent: Nov. 7, 2006

(54) TUNGSTEN POLISHING SOLUTION

(75) Inventors: Terence M. Thomas, Newark, DE (US); Stephan De Nardi, Newark, DE (US); Wade Godfrey, Landenberg, PA (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 49 days.

(21) Appl. No.: 10/350,859

(22) Filed: Jan. 24, 2003

(65) Prior Publication Data
US 2003/0139050 A1  Jul. 24, 2003

Related U.S. Application Data

(63) Continuation-in-part of application No. 10/056,342, filed on Jan. 24, 2002, now abandoned.

(51) Int. Cl.
*C09K 5/00* (2006.01)
(52) U.S. Cl. .................. 252/79.1; 252/79.2; 252/79.3; 252/79.4
(58) Field of Classification Search ............... 252/79.1, 252/79.2, 79.3, 79.4
See application file for complete search history.

(56) References Cited

U.S. PATENT DOCUMENTS

| | | | |
|---|---|---|---|
| 5,391,258 A | 2/1995 | Brancaleoni et al. | |
| 5,714,407 A | 2/1998 | Maeno et al. | |
| 5,958,288 A | 9/1999 | Mueller et al. | |
| 5,993,686 A | 11/1999 | Streinz et al. | |
| 6,001,269 A | 12/1999 | Sethuraman et al. | |
| 6,083,419 A | 7/2000 | Grumbine et al. | |
| 6,117,783 A | 9/2000 | Small et al. | |
| 6,136,711 A | 10/2000 | Grumbine et al. | |
| 6,383,065 B1* | 5/2002 | Grumbine et al. | ........... 451/526 |
| 2001/0013506 A1 | 8/2001 | Chamberlin et al. | |
| 2002/0092827 A1* | 7/2002 | Sun et al. | ..................... 216/88 |

FOREIGN PATENT DOCUMENTS

| | | |
|---|---|---|
| WO | WO 99/67056 A1 | 12/1999 |
| WO | WO 01/02134 A1 | 1/2001 |
| WO | WO 01/21724 A1 | 3/2001 |

\* cited by examiner

*Primary Examiner*—George A. Goudreau
(74) *Attorney, Agent, or Firm*—Blake T. Biederman

(57) ABSTRACT

A tungsten CMP solution for planarizing semiconductor wafers includes a primary oxidizer having a sufficient oxidation potential for oxidizing tungsten metal to tungsten oxide; and the tungsten CMP solution has a static etch rate for removing the tungsten metal. A secondary oxidizer lowers the static etch rate of the tungsten CMP solution. The secondary oxidizer is selected from the group consisting of bromates and chlorates. Optionally the tungsten CMP contains 0 to 50 weight percent abrasive particles; and it contains a balance of water and incidental impurities.

13 Claims, No Drawings

TUNGSTEN POLISHING SOLUTION

This application is a continuation-in-part of U.S. Ser. No. 10/056,342, filed Jan. 24, 2002 now abandoned.

BACKGROUND OF THE INVENTION

The invention relates to tungsten chemical mechanical polishing and in particular to tungsten CMP solutions having a controlled static etch rate. Tungsten CMP slurries rely upon both tungsten etch and mechanical abrasion to planarize the tungsten's surface. Competing chemical reactions take place during tungsten CMP. The first of these is an oxidation reaction. During oxidation, the oxidizing agent acts to form a tungsten oxide with the surface of the substrate. The second reaction is the complexing reaction. In this reaction, the complexing agent actively dissolves the oxide film growing on the substrate from the oxidation reaction.

Because of tungsten's high stability, tungsten slurries must typically rely upon powerful oxidizers. In view of this, strong oxidizers such as halogen oxides have been used or proposed as oxidation agents for tungsten polishing slurries. For example, Streinz et al., in U.S. Pat. No. 5,993,686, disclose oxidizing metal salts, oxidizing metal complexes, nonmetallic oxidizing acids such as peracetic and periodic acids, iron salts such as nitrates, sulfates, EDTA, citrates, potassium ferricyanide, hydrogen peroxide, potassium dichromate, potassium iodate, potassium bromate, vanadium trioxide and the like, aluminum salts, sodium salts, potassium salts, ammonium salts, quaternary ammonium salts, phosphonium salts, or other cationic salts of peroxides, chlorates, perchlorates, nitrates, permanganates, persulfates and mixtures thereof. Similarly, Mravic et al., in WO 99/67056, disclose the use of hydrogen peroxide, potassium ferricyanide, potassium dichromate, potassium iodate, potassium bromate, vanadium trioxide, hypochlorous acid, sodium hypochlorite, potassium hypochlorite, calcium hypochlorite, magnesium hypochlorite, ferric nitrate and mixtures thereof. These oxidizers such as, halo-oxides chemically react with the substrate surface to form a metal oxide. Then slurry abrasive from the CMP process removes the inhibited tungsten oxide from the surface of the substrate. In this manner, the CMP process removes material from the substrate and planarizes its surface.

Iodate-containing slurries used in tungsten CMP have the ability to inhibit the static etching process. Unfortunately, although iodate-based slurries succeed in inhibiting static etching, they also have the following undesirable properties: 1) requiring aggressive alumina particles to remove the tungsten oxide that can result in scratching; 2) requiring appropriate equipment for iodine removal in accordance with established environmental regulations; and 3) contact of the slurry with polishing equipment results in the equipment turning an undesirable brownish-yellow color.

In U.S. Pat. No. 5,958,288, Mueller et al. conclude that iron-containing oxidizers, such as ferric nitrate, can act as a catalyst to promote tungsten removal when iron is present in an amount less than 3,000 ppm. The problem with these slurries is that tungsten static etching is a common side effect. After the CMP process, the metal polishing slurry that remains on the surface of the substrate continues to etch the substrate. Sometimes, static etch has beneficial consequences for some semiconductor integration schemes. But in most instances, minimizing static etch improves semiconductor performance. In addition, static etch may also contribute to surface defects such as pitting and key-holing. These surface defects significantly affect the final properties of the semiconductor device and hamper its usefulness.

Grumbine et al., in U.S. Pat. No. 6,083,419, disclose the use of nitrogen containing oxidizer to control static etch. Unfortunately, as far as known, these compounds have only a limited impact upon static etch rates. At present there is an ongoing need for a tungsten polishing slurry that has both a rapid tungsten removal rate and limited static etch. In addition, there is a need for a polishing slurry that also eliminates the scratching, environmental and cosmetic issues associated with iodate-containing slurries.

STATEMENT OF THE INVENTION

The invention provides a tungsten CMP solution for planarizing semiconductor wafers comprising a primary oxidizer having a sufficient oxidation potential for oxidizing tungsten metal to tungsten oxide and the tungsten CMP solution has a static etch rate for removing the tungsten metal; a secondary oxidizer lowers the static etch rate of the tungsten CMP solution, the secondary oxidizer is selected from the group consisting of bromates and chlorates; 0 to 50 weight percent abrasive particles; and a balance of water and incidental impurities.

Alternatively, the invention provides a tungsten CMP solution for planarizing semiconductor wafers comprising an iron-containing primary oxidizer having a sufficient oxidation potential for oxidizing tungsten metal to tungsten oxide and the tungsten CMP solution having a static etch rate for removing the tungsten metal; a secondary oxidizer for polishing method for lowering the static etch rate of the tungsten CMP solution, the secondary oxidizer being selected from the group consisting of bromates, chlorates and iodates; 0 to 50 weight percent abrasive particles; and a balance of water and incidental impurities.

DETAILED DESCRIPTION

It has been discovered that secondary oxidizers such as bromate, chlorate and iodate react to form a film that covers tungsten and forms an effective inhibitor for tungsten polishing solutions and slurries. For purposes of the specification, polishing solution refers to aqueous polishing solutions that may or may not include abrasives. If the polishing solution includes an abrasive, then the polishing solution also is a polishing slurry.

The polishing solution relies upon a strong primary oxidizer having a sufficient oxidation potential for oxidizing tungsten metal to tungsten oxide. Most advantageously, the primary oxidizer is selected from the group consisting of hydrogen peroxide, ferrocyanides, dichromates, vanadium trioxide, hypochlorous acid, hypochlorites, nitrates, persulfates, permanganates, hydroxides and combinations thereof. Additional specific examples include, potassium ferrocyanide, sodium ferrocyanide, potassium dichromate, sodium dichromate, calcium hypochlorite, potassium hypochlorite, sodium hypochlorite, potassium nitrate, sodium nitrate, potassium permanganate, sodium permanganate and combinations thereof Often mixtures of these primary oxidizers can further enhance removal rates. The polishing solution typically contains a total of 0.1 to 12 weight percent primary oxidizer—for purposes of this specification, all concentrations are expressed in weight percent unless specifically reference otherwise. When adding unstable primary oxidizers to the polishing solution, such as hydrogen peroxide, it usually is necessary to add these at or near the point of use. Advantageously, the polishing solution typically contains a total of 0.5 to 10 weight percent primary oxidizer. Most advantageously, the polishing solution typically contains a total of 1 to 7.5 weight percent primary oxidizer.

Advantageously, the primary oxidizer contains either hydrogen peroxide or an iron-containing oxidizer. Most advantageously, the primary oxidizer is an iron-containing oxidizer. Iron-containing oxidizers provide dramatic removal rates for tungsten even when present in small concentrations. Advantageously, an addition of 0.0005 to 10 weight percent ferric nitrate increases tungsten removal rate. Most advantageously, the slurry contains 0.001 to 8 weight percent ferric nitrate. Furthermore, the inhibitor film formed is even effective for polishing solutions containing 2 to 7.5 weight percent ferric nitrate A secondary oxidizer bonds with tungsten to form the static etch inhibiting film. The inhibiting compound forms a surface film that blocks the dissolution of the metallic oxide on the surface of the substrate. This barrier is effective against the most aggressive oxidizers required to planarize tungsten. In addition to the forming the barrier film, the secondary oxidizer does have sufficient oxidizing potential to oxidize tungsten. The secondary oxidizer however typically only contributes a minor percentage of the total tungsten oxidation. But for example with some high ferric nitrate-containing compositions, the higher secondary oxidizer concentrations can contribute a significant percentage of the tungsten oxidation.

For most primary oxidizers, the secondary oxidizer is bromate ($BrO_3^-$), chlorate ($ClO_3^-$) or a mixture thereof. But for solutions having iron-containing primary oxidizers, the secondary oxidizer may be a bromate, chlorate, iodate or mixtures thereof. Unfortunately, iodate-containing slurries normally have the disadvantages of costly environmental disposal and the cosmetic discoloration. However, in the case of high concentrations of the dark-red-orange color associated with ferric nitrate solutions, this is less of an issue. Advantageously, solid powder compounds provide an effective manner for adding bromates, chlorates and iodates to a polishing solution or slurry. Specific examples of these compounds include alkali metals such as ammonium, potassium, sodium, alkaline earth metals such as magnesium or other salts. Alkaline halogenated compounds are readily available commercially, or may be synthesized. Advantageously, the solid powder compound is potassium bromate ($KBrO_3$), potassium chlorate ($KClO_3$), potassium iodate ($KCIO_3$) or mixtures thereof. In view of environmental concerns, these potassium compounds are preferred over sodium or alkaline earth metals. In addition, it is possible to add chlorine, bromine or iodine as elemental constituents or as other compounds to the polishing solution. The strong primary oxidizer then oxidizes these secondary oxidizers into bromates, chlorates or iodates, respectively with rapid kinetics—since the primary oxidizers lack the oxidation potential to oxidize fluorine, these kinetics do not apply to fluorine. In the same fashion, perchlorate, perbromate and periodate form the respective chlorate, bromate and iodate during tungsten oxidation.

Advantageously, the polishing solution has a static etch removal rate of less than 400 angstroms/minute and a removal rate of at least 3000 angstroms/minute. Most advantageously, the polishing solution has a static etch removal rate of less than 200 angstroms/minute and a removal rate of at least 4000 angstroms/minute. The amount of secondary oxidizer necessary to control static depends upon the type of polishing solution and the particular secondary oxidizer. In most instances, the concentration of secondary oxidizer in the metal polishing solution does not exceed its maximum solubility. In some cases, exceeding this concentration can leave solid, undissolved particles of the secondary oxidizer in the polishing solution. Undissolved particles of the secondary oxidizer could interfere with the polishing and etching abilities of the polishing solution.

The secondary oxidizer concentration can range from a small but effective concentration up to the solubility limit in the particular polishing solution. The solubility limit of the secondary oxidizer depends on the polishing solution's chemistry. The solubility limit can range from 1.8 wt % to 22 wt % concentration in the polishing solution. Advantageously, the secondary oxidizer concentration ranges from 0.0001 wt % to 7.5 weight percent. Most advantageously, the secondary oxidizer ranges from 0.001 wt to 5 weight percent. When the polishing solution contains relatively large amounts of ferric nitrate (2 to 7.5 weight percent), the polishing solution advantageously contains 0.1 to 5 weight percent secondary oxidizer.

Optionally, the polishing solution contains 0 to 50 weight percent abrasive particles. Advantageously, the polishing solution contains 0 to 30 weight percent abrasive particles. Most advantageously, the polishing solution contains 0 to 25 weight percent abrasive particles. The abrasive particles, when present, mechanically remove the tungsten oxide layer. Examples of acceptable abrasive particles include the following: alumina, ceria, diamond, iron oxide, silica, silicon carbide, silicon nitride, titanium oxide or a combination thereof. Advantageously, the abrasive particles are alumina or silica. Most advantageously, the abrasive particles are silica. In addition, the abrasive particles advantageously have an average particle size of less than 250 nm. Most advantageously, the average particle size is less than 150 nm.

If the polishing solution is free of abrasive particles, then it may be advantageous to employ a fixed abrasive pad. Most advantageously, abrasive free solutions simply employ a polymeric pad in combination with a more aggressive combination of primary oxidizers.

In addition, the polishing solution optionally contains a complexing agent for assisting with the removal of the tungsten. If present, the complexing agent is typically a carboxylic acid that removes the tungsten oxide layer from the substrate. For example, acceptable complexing agents include the following: malonic acid, lactic acid, sulfosalicylic acid ("SSA"), formic acid, acetic acid, propanoic acid, butanoic acid, pentanoic acid, hexanoic acid, heptanoic acid, octanoic acid, nonanoic acid, and mixtures thereof. Typical polishing solution may contain 0 to 15 weight percent complexing agent. Most advantageously, the polishing solution contains 0.5 to 5 weight percent complexing agent. For certain circumstances, such as polishing solutions that do not contain hydrogen peroxide, the complexing agent may not unnecessary.

The aqueous polishing solutions have a balance of water and incidental impurities. Most advantageously, the water is deionized water. Furthermore, the aqueous polishing solutions can operate with either an acidic or basic pH. Advantageously, the polishing solution operates with an acidic pH. Most advantageously, the polishing solution operates with a pH of less than 6. The pH of the solution is measured by conventional methods after mixing the secondary oxidizer into the polishing solution; and it can be adjusted by adding a base, such as ammonium hydroxide, or a mineral acid, such as nitric acid. Nitric acid further assists removal rate when used in combination with ferric nitrate.

EXAMPLE

Potassium chlorate was added in differing weight percentages to a tungsten polishing slurry. Table I provides the composition of the tungsten polishing slurry.

TABLE I

| Generic Slurry Composition In Water | |
| --- | --- |
| Hydrogen Peroxide | 4 wt % |
| Ferric Nitrate | 0.01 wt % |
| Malonic Acid | 0.07 wt % |
| Lactic Acid | 1.5 wt % |
| SSA | 0.01 wt % |

The pH of the resultant slurry was adjusted to about 3 with ammonium hydroxide. The resultant slurry was then used to etch and polish standard tungsten substrates via CMP. Substrate thickness was measured over time. The change in thickness was plotted against the time of etching and the slope of the graph was measured to determine the etching rate. The static etch rate data are shown below in Table II.

TABLE II

| Etch Rate of Tungsten Metal Polishing Slurry at pH = 3 Potassium Chlorate Etch Inhibitor | |
| --- | --- |
| $KClO_3$ wt. % | Static Etch Rate (angstroms/min.) |
| 0 | 340 |
| 0.01 | 200 |
| 0.1 | 126 |
| 1 | 70 |

The data in Table II show that a 0.01% potassium chlorate slurry solution reduces the static etch removal rate of tungsten a significant amount. Furthermore, increasing the potassium chlorate further enhanced the static etch inhibiting ability of the solution—the precise amount of potassium chlorate needed to reach a 200 angstrom/minute static etching rate is dependent on the particular slurry. For example, a particularly acidic slurry solution using $KClO_3$ may require a different concentration of secondary inhibitor to reduce the static etching rate below 200 angstrom/minute than a more basic slurry solution.

The addition of a secondary oxidizer selected from the group consisting of bromates, chlorates and iodates provides a tungsten polishing solution that has both a rapid tungsten removal rate and limited static etch. In addition, the polishing solution eliminates the scratching associated with conventional iodate-containing slurries. Finally, for polishing solutions containing bromates, chlorates or mixtures thereof, the polishing solution eliminates the environmental and cosmetic issues associated with iodate.

The invention claimed is:

1. A tungsten CMP solution for planarizing semiconductor wafers comprising:
   a primary oxidizer having a sufficient oxidation potential for oxidizing tungsten metal to tungsten oxide and the tungsten CMP solution having a static etch rate for removing the tungsten metal;
   a secondary oxidizer for lowering the static etch rate of the tungsten CMP solution to less than 200 Angstroms per minute, the secondary oxidizer being selected from bromates, chlorates and mixtures thereof;
   0 to 50 weight percent abrasive particles; and
   a balance of water and incidental impurities.

2. The tungsten CMP solution of claim 1 wherein the primary oxidizer is selected from hydrogen peroxide, ferrocyanides, dichromates, vanadium trioxide, hypochlorous acid, hypochlorites, nitrates, persulfates, permanganates, hydroxides and mixtures thereof.

3. A tungsten CMP solution for planarizing semiconductor wafers comprising:
   an iron-containing primary oxidizer having a sufficient oxidation potential for oxidizing tungsten metal to tungsten oxide and the tungsten CMP solution having a static etch rate for removing the tungsten metal;
   a secondary oxidizer for lowering the static etch rate of the tungsten CMP solution to less than 200 Angstroms per minute, the secondary oxidizer being selected from bromates, chlorates and mixtures thereof;
   0 to 50 weight percent abrasive particles; and
   a balance of water and incidental impurities.

4. The tungsten CMP solution of claim 3 wherein the primary oxidizer includes iron nitrate.

5. The tungsten CMP solution of claim 3 having by weight percent 0.1 to 12 total primary oxidizer, the primary oxidizer including 0.0005 to 10 ferric nitrate, 0.0001 to 7.5 secondary oxidizer and 0 to 30 abrasive particles.

6. The tungsten CMP solution of claim 3 having by weight percent 0.5 to 10 total primary oxidizer, the primary oxidizer including 0.00 1 to 8 ferric nitrate, 0.001 to 5 secondary oxidizer and 0 to 25 abrasive particles and a pH of less than 6.

7. The tungsten CMP solution of claim 6 including nitric acid and having by weight percent 0 to 15 complexing agent.

8. The tungsten CMP solution of claim 7 having by weight percent 1 to 7.5 total primary oxidizer, the primary oxidizer including 2 to 7.5 ferric nitrate and 0.1 to 5 secondary oxidizer.

9. A tungsten CMP solution for planarizing semiconductor wafers comprising by weight percent:
   0.1 to 12 total primary oxidizer, the primary oxidizer containing iron and having a sufficient oxidation potential for oxidizing tungsten metal to tungsten oxide and the tungsten CMP solution having a static etch rate for removing the tungsten metal;
   0.0001 to 7.5 secondary oxidizer for lowering the static etch rate of the tungsten CMP solution to less than 200 Angstroms per minute, the secondary oxidizer being selected from bromates, chlorates, iodates and mixtures thereof;
   0 to 50 weight percent abrasive particles; and
   a balance of water and incidental impurities.

10. The tungsten CMP solution of claim 9 having by weight percent 0.5 to 10 total primary oxidizer, the primary oxidizer including 0.0005 to 10 ferric nitrate, 0.001 to 5 secondary oxidizer and 0 to 30 abrasive particles.

11. The tungsten CMP solution of claim 9 having by weight percent 0.5 to 10 total primary oxidizer, the primary oxidizer including 0.001 to 8 ferric nitrate, 0.001 to 5 secondary oxidizer and 0 to 25 abrasive particles and a pH of less than 6.

12. The tungsten CMP solution of claim 11 including nitric acid and having by weight percent 0 to 15 complexing agent.

13. The tungsten CMP solution of claim 12 having by weight percent 1 to 7.5 total primary oxidizer, the primary oxidizer including 2 to 7.5 ferric nitrate and 0.1 to 5 secondary oxidizer.

* * * * *